(12) United States Patent
D'Luna et al.

(10) Patent No.: US 7,246,341 B2
(45) Date of Patent: Jul. 17, 2007

(54) BYTE SLICE BASED DDR TIMING CLOSURE

(75) Inventors: Lionel D'Luna, Irvine, CA (US); Tom Hughes, Dana Point, CA (US); Sathish Kumar Radhakrishnan, Bangalore (IN)

(73) Assignee: Broadcom Corporation, Irvine, CA (US)

( * ) Notice: Subject to any disclaimer, the term of this patent is extended or adjusted under 35 U.S.C. 154(b) by 197 days.

(21) Appl. No.: 10/917,693

(22) Filed: Aug. 13, 2004

(65) Prior Publication Data

US 2005/0050510 A1  Mar. 3, 2005

Related U.S. Application Data

(60) Provisional application No. 60/495,585, filed on Aug. 15, 2003.

(51) Int. Cl.
*G06F 17/50* (2006.01)

(52) U.S. Cl. .............. 716/18; 716/9; 716/10; 716/3

(58) Field of Classification Search .......... 716/18, 716/9, 10, 3
See application file for complete search history.

(56) References Cited

U.S. PATENT DOCUMENTS

| | | | | |
|---|---|---|---|---|
| 6,151,568 A | * | 11/2000 | Allen et al. .............. 703/14 |
| 6,216,252 B1 | * | 4/2001 | Dangelo et al. .......... 716/1 |
| 6,324,678 B1 | * | 11/2001 | Dangelo et al. .......... 716/18 |
| 6,539,536 B1 | * | 3/2003 | Singh et al. .............. 716/18 |
| 7,047,372 B2 | * | 5/2006 | Zeitler et al. ............ 711/154 |
| 7,055,113 B2 | * | 5/2006 | Broberg et al. .......... 716/1 |
| 2004/0261050 A1 | * | 12/2004 | Broberg et al. .......... 716/18 |
| 2005/0125751 A1 | * | 6/2005 | Miller et al. ............. 716/4 |
| 2005/0149898 A1 | * | 7/2005 | Hakewill et al. ........ 716/18 |

OTHER PUBLICATIONS

Camposano, "From Behavior to Structure High-Level Synthesis", IEEE Design & Test of Computers, vol. 7, No. 5, Oct. 1990, pp. 8-19.*
Hascsi et al., "High-Level Synthesis of an Enhanced Connex Memory", 1996 International Semiconductor Conference, vol. 1, Oct. 9-12, 1996, pp. 163-166.*
O'Connor et al., "Automated Synthesis of Current-Memory Cells", IEEE Transactions on Computer-Aided Design of Integrated Circuits and Systems, vol. 19, No. 4, Apr. 2000, pp. 413-424.*
Chen, "Data Path Synthesis in Digital Electronics .I. Memory Allocation", IEEE Transactions on Aerospace and Electronic Systems, vol. 32, No. 1, Jan. 1996, pp. 2-15.*
Berthet et al., "Synthesis of VHDL Arrays on RAM Cells", European Design Automation Conference, Sep. 7-10, 1992, pp. 726-731.*

(Continued)

*Primary Examiner*—Phallaka Kik
(74) *Attorney, Agent, or Firm*—McAndrews, Held & Malloy Ltd.

(57) ABSTRACT

Presented herein is a system and method for byte slice based DDR timing closure. In one embodiment, there is presented a method for synthesizing/laying out a dual data rate memory, said method comprising synthesizing/laying out a portion of the dual data rate memory; replicating the portion; and placing the synthesized/laid out portion and the replicated portions in proximity to a corresponding plurality of pads.

9 Claims, 4 Drawing Sheets

OTHER PUBLICATIONS

Aloqeely, "A Simple Alternative for Storage Allocation in High-Level Synthesis", Proceedings of the 1998 IEEE International Symposium on Circuits and Systems, vol. 6, May 31-Jun. 3, 1998, pp. 377-380.*

Prakash et al., "Synthesis of Application-Specific Multiprocessor Systems Including Memory Components", Proceedings of the International Conference on Application Specific Array Processors, Aug. 4-7, 1992, pp. 118-132.*

Hettiaratchi et al., "Performance-Area Trade-Off of Address Generators for Address Decoder-Decoupled Memory", 2002 Proceedings of Design, Automation and Test in Europe Conference and Exhibition, Mar. 4-8, 2002, pp. 902-908.*

Gharsalli et al., "Automatic Generation of Embedded Memory Wrapper for Multiprocessor SoC", 2002 Proceedings of 39th Design Automation Conference, Jun. 10-14, 2002, pp. 596-601.*

Suresh et al., "Synthesizable RAM-Alternative to Low Configuration Compiler Memory for Die Area Reduction", Thirteenth International Conference on VLSI Design, Jan. 3-7, 2000, pp. 512-517.*

* cited by examiner

BYTE SLICE BASED DDR TIMING CLOSURE

RELATED APPLICATIONS

This application claims priority to "Byte Slice Based DDR Timing Closure", Provisional Application for U.S. Patent, Ser. No. 60/495,585, filed Aug. 15, 2003, which is incorporated herein by reference in its entirety for all purposes.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

A dual data rate (DDR) memory is characterized by a data signal that provides bits of information during the rising edge of a clock signal as well as the falling edge of the DQS signal. Accordingly, 2 bits/cycle are possible. The data signal is to be sampled at 90 and 270 degrees phase shift from the DQS signal.

As the clock signal increases, such as from 100 MHz to 200 MHz, the time period shrinks from 10 ns to 5 ns. Skews that may be permissible for slower clocks become unacceptable for faster clocks.

Integrated circuits are generally designed using synthesis tools. The timing for data pins in a DDR memory are carefully measured and adjusted. However, as the number of data pins increases, the effort is also repeated. This leads to increased prefabrication period.

Further limitations and disadvantages of conventional and traditional systems will become apparent to one of skill in the art through comparison of such systems with the invention as set forth in the remainder of the present application with reference to the drawings.

BRIEF SUMMARY OF THE INVENTION presented herein is a system and method for byte slice based DDR timing closure.

In one embodiment, there is presented a method for synthesizing/laying out a dual data rate memory, said method comprising synthesizing/laying out a portion of the dual data rate memory; replicating the portion; and placing the synthesized/laid out portion and the replicated portions in proximity to a corresponding plurality of pads.

In another embodiment, the portion comprises a plurality of input/outputs.

In another embodiment, the plurality of input/outputs comprises a byte lane.

In another embodiment, synthesizing/laying out the portion further comprises generating a macro, said macro synthesizing/laying out the portion.

In another embodiment, the macro comprises a plurality of cells, each of said cells corresponding to a particular one of the plurality of input/outputs.

In another embodiment, there is presented a computer readable media for synthesizing a dual data rate memory controller. The computer readable media stores a plurality of instructions. The plurality of instructions comprises receiving a macro representing a portion of the dual data rate memory controller; replicating the macro; and placing the macro and the replicated macros in proximity to a corresponding plurality of pads.

In another embodiment, the portion comprises a plurality of input/outputs.

These and other advantageous and novel features as well as details of illustrated embodiments will be more fully understood from the following description and drawings.

DETAILED DESCRIPTION OF THE INVENTION

Figure 1:
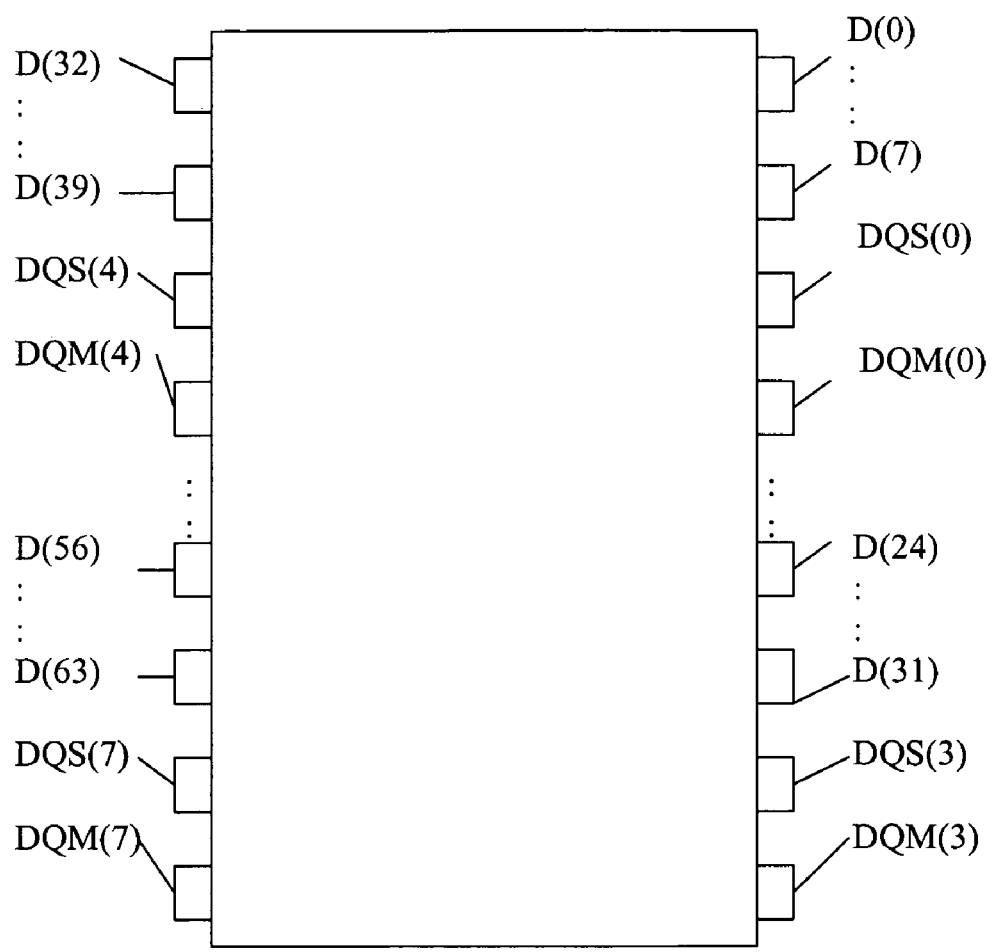
FIG. 1 is a block diagram of an exemplary dual data rate memory controller interface.

Referring now to FIG. 1, there is illustrated a block diagram describing an exemplary 64-bit dual data rate memory. The dual data rate memory controller is an integrated circuit comprising of say 64 data pins D(0)...D(63), eight data strobe signal pins DQS(0)...DQS(7), and eight data mask signals DQM(0)...DQM(7). Each eight of the data pins, e.g., D(0)...D(7), is associated with a particular one of the data strobe signal pins, e.g., DQS(0), and a particular one of the data mask signals, e.g., DQM(0). The eight data pins D(0)...D(7), the associated data strobe signal DQS(0), and the data mask signal DQM(0), are collectively referred to as a byte lane.

The data signal pins D provide or receive data signals. The data signals are synchronized with a clock, such that the data signal pins D provide/receive a bit of information during both a high cycle and low cycle of the clock signal. Accordingly, during each clock cycle, each data pin D can either provide or receive two bits per clock cycle.

During a memory write, a memory controller provides the data signals to the data pins D; along with data strobe signals DQS. The data strobe signals DQS are shifted 90 degrees with respect to the data signals. The DDR memory latches the data signals at both the rising edge and the following edge of the DQS signal.

During a memory read, the DDR memory provides the DQS signals, DQS(0)...DQS(7), along with the data signals D(0)...D(63). The DQS signals are aligned with the data signals.

As the clock signal for the DDR memory becomes faster, timing skews that are acceptable for slower clocks signals become unacceptable for faster clocks signals. Thus, minimal timing skews between the data pins D are permissible.

Integrated circuits, such as DDR memory controllers are generally converted from RTL to gates/layout using synthesis/layout tools. During the design, the timing of data paths associated with the data pins D are carefully measured and adjusted. However, as in the present illustration, with 64 pins, the efforts increase.

Figure 2:
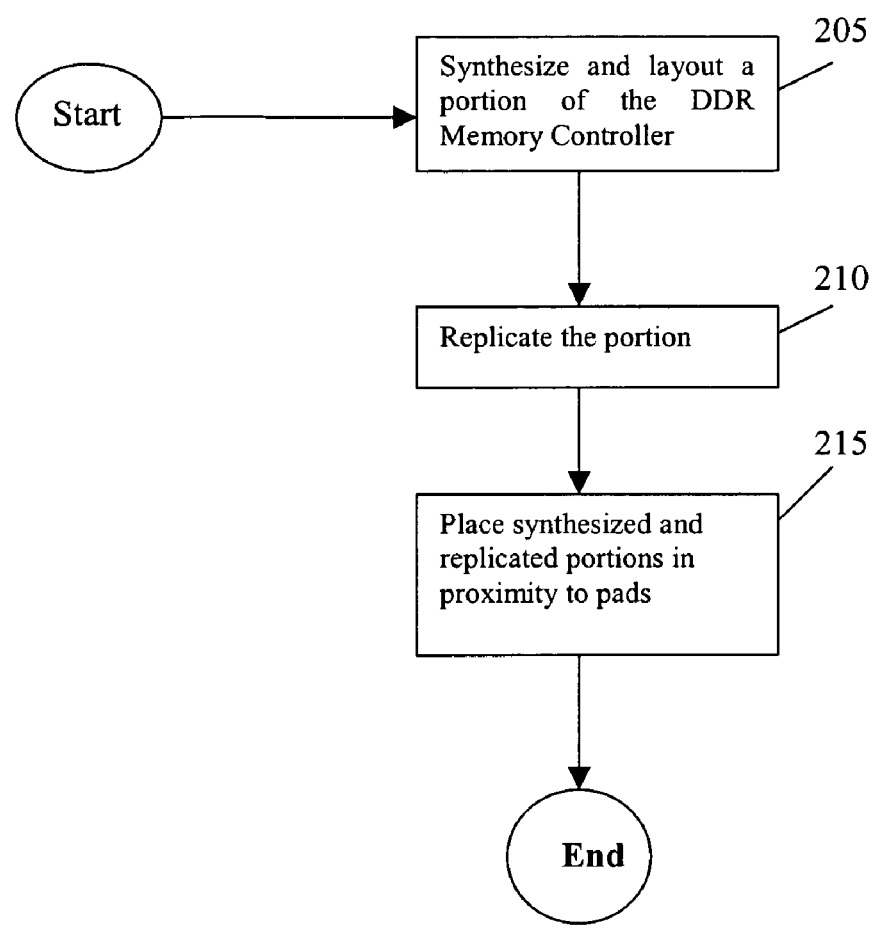
FIG. 2 is a flow diagram for synthesizing the dual data rate memory controller in accordance with an embodiment of the present invention.

Referring now to FIG. 2, there is illustrated a flow diagram for synthesizing a dual data rate memory controller in accordance with an embodiment of the present invention. At 205, a portion of the dual data rate memory controller is synthesized. According to certain aspects of the invention, the portion can comprises, for example, a byte lane. The portion is synthesized and laid out such that the timing is measured and appropriate.

Additionally, according to certain aspects of the present invention, the portion of the dual data rate memory controller can be represented by what is known as a macro. The macro comprises a plurality of cells, each of which corresponds to a particular one of the data pins D. At 210, the portions are replicated as needed. At 215, each of the synthesized portion and the replication portions are placed in proximity to a corresponding plurality of pads.

Figure 3:
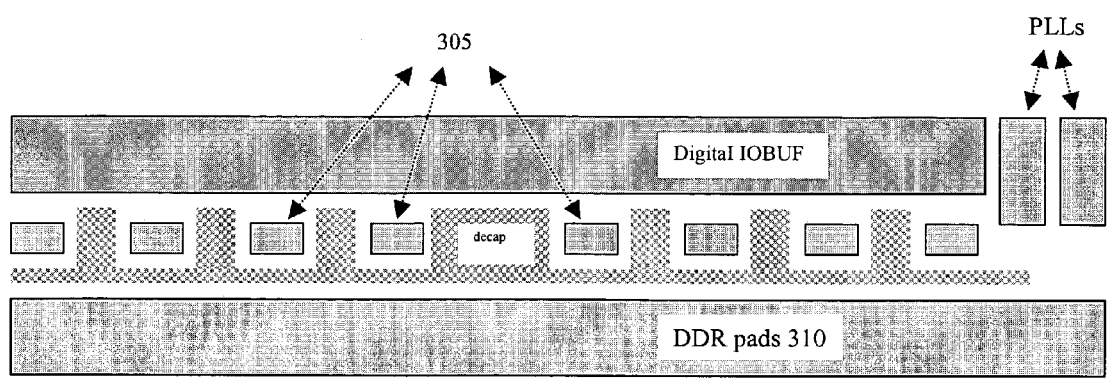
FIG. 3 is a block diagram of a synthesized dual data rate memory controller portion in accordance with an embodiment of the present invention.

Referring now to FIG. 3, there is illustrated a block diagram describing an exemplary synthesized DDR memory controller in accordance with an embodiment of the present invention. Each of the byte lanes is associated with a particular one of a plurality of macros 305. Each of the macros is placed in proximity with pads 310.

Figure 4:
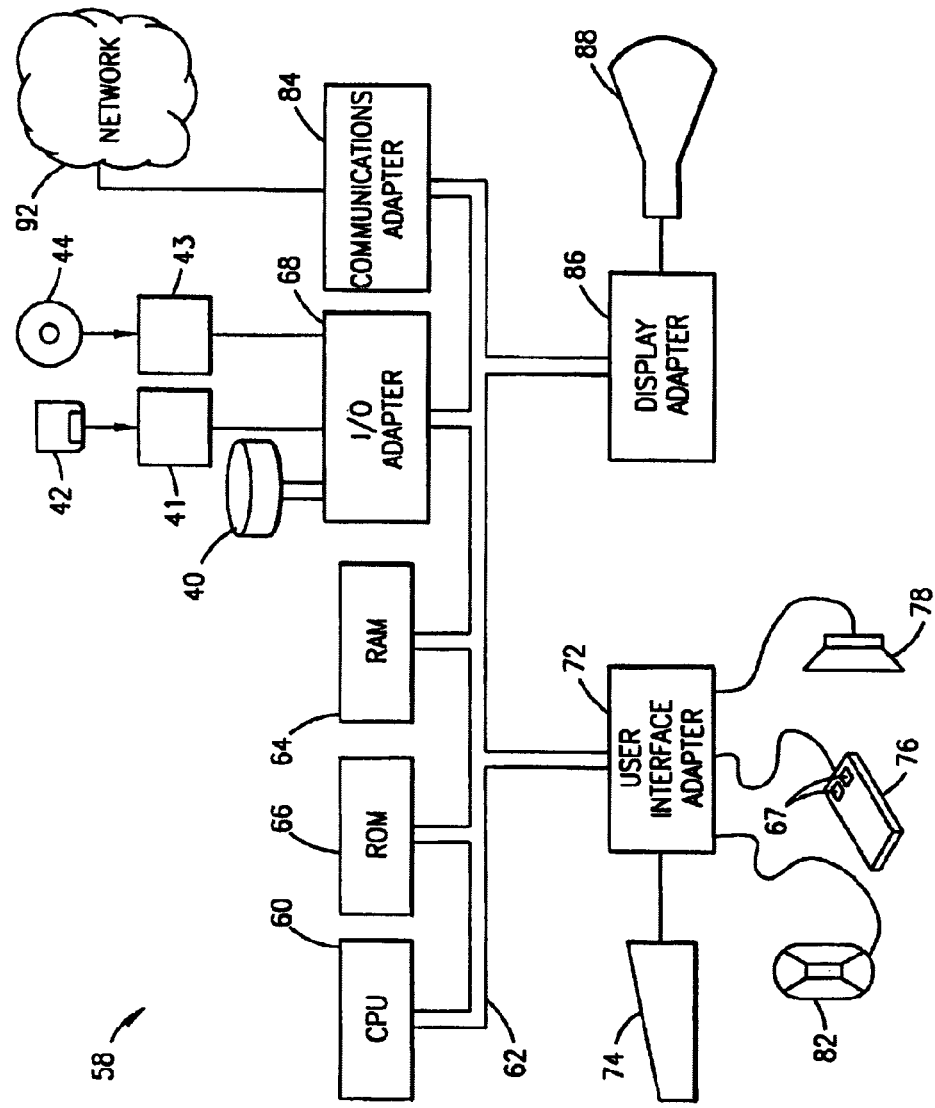
FIG. 4 is a block diagram of an exemplary computer system in accordance with an embodiment of the present invention.

Referring now to FIG. 4, a representative hardware environment for practicing the present invention is depicted and illustrates a typical hardware configuration of a computer information handling system 58 in accordance with the subject invention, having at least one central processing unit (CpU) 60. CpU 60 is interconnected via system bus 12 to random access memory (RAM) 64, read only memory (ROM) 66, and input/output (I/O) adapter 68 for connecting peripheral devices such as disc units 70 and tape drives 90 to bus 62, user interface adapter 72 for connecting keyboard 74, mouse 76 having button 67, speaker 78, microphone 82, and/or other user interfaced devices such as a touch screen device (not shown) to bus 62, communication adapter 84 for connecting the information handling system to a data processing network 92, and display adapter 86 for connecting bus 62 to display device 88.

Although the invention has been described with a certain degree of particularity, it should be recognized that elements thereof may be altered by persons skilled in the art without departing from the spirit and scope of the invention. One of the embodiments of the invention can be implemented as sets of instructions resident in the random access memory 64 of one or more computer systems configured generally as described in FIG. 4. Until required by the computer system, the set of instructions may be stored in another computer readable memory, for example in a hard disk drive, or in a removable memory such as an optical disk for eventual use in a CD-ROM drive or a floppy disk for eventual use in a floppy disk drive. Further, the set of instructions can be stored in the memory of another computer and transmitted over a local area network or a wide area network, such as the Internet, when desired by the user. One skilled in the art would appreciate that the physical storage of the sets of instructions physically changes the medium upon which it is stored electrically, magnetically, or chemically so that the medium carries computer readable information. The invention is limited only by the following claims and their equivalents.

The invention claimed is:

1. A method for synthesizing & laying out a dual data rate memory interface, said method comprising:
   synthesizing a portion of the dual data rate memory;
   replicating the portion; and
   placing the synthesized portion and the replicated portions in proximity to a corresponding plurality of pads.

2. The method of claim 1, wherein the portion comprises a plurality of input/outputs.

3. The method of claim 2, wherein the plurality of input/outputs comprise a byte lane.

4. The method of claim 2, wherein synthesizing the portion further comprises:
   generating a macro, said macro synthesizing the portion.

5. The method of claim 4, wherein said macro comprises a plurality of cells, each of said cells corresponding to a particular one of the plurality of input/outputs.

6. A computer readable media for synthesizing a dual data rate memory interface, said computer readable media comprising a plurality of instructions, the plurality of instructions comprising:
   receiving a macro representing a portion of the dual data rate memory;
   replicating the macro; and
   placing the macro and the replicated macros in proximity to a corresponding plurality of pads.

7. The computer readable media of claim 6, wherein the portion comprises a plurality of input/outputs.

8. The computer readable media of claim 7, wherein the plurality of input/outputs comprise a byte lane.

9. The computer readable media of claim 6, wherein said macro comprises a plurality of cells, each of said cells corresponding to a particular one of the plurality of input/outputs.

* * * * *